United States Patent
Lien et al.

(10) Patent No.: US 6,576,976 B2
(45) Date of Patent: Jun. 10, 2003

(54) SEMICONDUCTOR INTEGRATED CIRCUIT WITH AN INSULATION STRUCTURE HAVING REDUCED PERMITTIVITY

(75) Inventors: Chuen-Der Lien, Los Altos Hills, CA (US); S. K. Lee, Fremont, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/791,316

(22) Filed: Feb. 22, 2001

(65) Prior Publication Data

US 2001/0040267 A1 Nov. 15, 2001

Related U.S. Application Data

(63) Continuation of application No. 08/775,345, filed on Jan. 3, 1997, now abandoned.

(51) Int. Cl.[7] .................................................. H01L 29/76
(52) U.S. Cl. ....................................... 257/522; 257/774
(58) Field of Search .................................. 257/522, 774

(56) References Cited

U.S. PATENT DOCUMENTS 3,890,636 A   6/1975   Harada et al. ................. 357/68
4,502,210 A   3/1985   Okumura et al. .............. 29/591
4,658,496 A   4/1987   Beinvogl et al. .............. 29/571
4,697,328 A   10/1987  Custode ........................ 437/41

(List continued on next page.)

FOREIGN PATENT DOCUMENTS

JP    1-89939 A     7/1989   ........... H01L/21/90
JP    1-318248 A    12/1989  ........... H01L/21/90

OTHER PUBLICATIONS

Fleming, J.G. et al., "Use of Air Gap Structures To Lower Intralevel Capacitance," Feb. 10–11, 1997 DUMIC Conference, 1997 ISMIC–222D/97/0139, pp. 139–146.

Primary Examiner—Stephen D. Meier
(74) Attorney, Agent, or Firm—Skjerven, Morrill, MacPherson LLP

(57) ABSTRACT

A first insulating layer (12) overlying semiconductor substrate (10) has a plurality of conductive paths (14, 16) disposed thereon. Each of the plurality of conductive paths has at least a major portion thereof overlied with a second insulating layer (20). A third insulating layer (26), having air gap ports (28) formed therein, overlies adjacent conductive paths and extends from one to another such that an air gap (34) is formed. A passivation layer (30) overlies third insulating layer and seals the plurality of air gaps ports to form an insulation structure (40) for a semiconductor integrated circuit, and method thereof.

6 Claims, 5 Drawing Sheets

U.S. PATENT DOCUMENTS

| | | | |
|---|---|---|---|
| 4,735,913 A | 4/1988 | Hayes | 437/39 |
| 4,801,560 A | 1/1989 | Wood et al. | 437/195 |
| 4,859,633 A | 8/1989 | Bayraktaroglu | 437/211 |
| 4,933,743 A | 6/1990 | Thomas et al. | 357/71 |
| 4,986,878 A | 1/1991 | Malazgirt et al. | 156/643 |
| 4,987,101 A | 1/1991 | Kaanta et al. | 437/228 |
| 5,001,079 A | 3/1991 | Van Laarhoven et al. | 437/50 |
| 5,119,164 A | 6/1992 | Sliwa, Jr. et al. | 357/54 |
| 5,148,260 A | 9/1992 | Inoue et al. | 357/67 |
| 5,155,576 A | 10/1992 | Mizushima | 357/71 |
| 5,192,715 A | 3/1993 | Sliwa, Jr. et al. | 437/195 |
| 5,217,926 A | 6/1993 | Langley | 437/228 |
| 5,278,103 A | 1/1994 | Mallon et al. | 437/240 |
| 5,296,092 A | 3/1994 | Kim | 156/643 |
| 5,302,233 A | 4/1994 | Kim et al. | 156/636 |
| 5,310,700 A | 5/1994 | Lien et al. | 437/195 |
| 5,324,682 A | 6/1994 | Tserng | 437/56 |
| 5,382,547 A | 1/1995 | Sultan et al. | 437/231 |
| 5,393,708 A | 2/1995 | Hsia et al. | 437/228 |
| 5,407,860 A | 4/1995 | Stoltz et al. | 437/180 |
| 5,461,003 A | 10/1995 | Havemann et al. | 437/187 |
| 5,486,493 A | 1/1996 | Jeng | 437/195 |
| 5,508,233 A | 4/1996 | Yost et al. | 437/228 |
| 5,591,677 A | 1/1997 | Jeng | 437/195 |
| 5,641,709 A | 6/1997 | Lee | 438/3 |
| 5,661,049 A | 8/1997 | Lur et al. | 438/303 |
| 5,668,398 A | 9/1997 | Havemann et al. | 257/522 |
| 5,677,574 A | 10/1997 | Hisaka | 257/776 |
| 5,728,631 A | 3/1998 | Wang | 438/787 |
| 5,736,446 A | 4/1998 | Wu | 438/305 |
| 5,744,378 A | 4/1998 | Homma | 437/195 |
| 5,747,382 A | 5/1998 | Huang et al. | 438/624 |
| 5,766,969 A | 6/1998 | Fulford, Jr. et al. | 437/44 |
| 5,770,507 A | 6/1998 | Chen et al. | 438/305 |
| 5,792,702 A | 8/1998 | Liang | 438/624 |
| 5,792,705 A | 8/1998 | Wang et al. | 438/624 |
| 5,798,298 A | 8/1998 | Yang et al. | 438/622 |
| 5,889,331 A | 3/1999 | Bai | 257/768 |
| 5,915,182 A | 6/1999 | Wu | 438/299 |
| 5,959,337 A | 9/1999 | Gardner et al. | 257/410 |
| 6,015,746 A | 1/2000 | Yeh et al. | 438/421 |
| 6,017,814 A | 1/2000 | Grill et al. | 438/619 |

SEMICONDUCTOR INTEGRATED CIRCUIT WITH AN INSULATION STRUCTURE HAVING REDUCED PERMITTIVITY

CROSS-REFERENCE TO RELATED APPLICATIONS

This application is a continuation of application Ser. No. 08/775,345, now abandoned entitled "Semiconductor Integrated Circuit with an Insulation Structure Having Reduced Permittivity," by Chuen-Der Lien and S. K. Lee, filed Jan. 3, 1997, which is incorporated herein by reference.

BACKGROUND

1. Field of Invention

The present invention relates generally to semiconductor integrated circuits and methods of fabricating such circuits. More specifically, it relates to semiconductor integrated circuits with an insulation structure having an a reduced permittivity incorporated therein.

2. Description of the Prior Art

As integrated circuits are scaled to meet the need for both higher performance levels and more complex integrated circuit solutions, the result is increased circuit density. One scaling method used is shrinking a circuit's horizontal geometries, thus reducing the spacing between features. As features such as adjacent conductive paths are brought closer to one another, capacitive coupling between the paths can become a barrier to the scaling process.

Adjacent conductive paths can be viewed as a parallel plates of a capacitor and the insulating material between them as the capacitor's dielectric. As it is known, capacitance is a function of the permittivity of the insulator ($\in_i$) divided by the thickness of the insulator ($x_i$).

$$C \in_i/X_i$$

Thus capacitance increases between conductive paths, for any given dielectric material, as they are brought closer together by, for example, a scaling process. This increase in capacitance results in an increase in the RC time constant which, as it is known, causes a decrease in circuit speed. Additionally, increases in capacitance between adjacent conductive paths also result in increases in inductive noise or cross-talk between the adjacent conductors.

As the above mentioned equation indicates, when the spacing between conductors decreases the capacitance will increase unless the permittivity of the dielectric is lowered. However, lower permittivity is difficult to achieve due to the limited number of materials suitable for semiconductor processing. The most common dielectric material used is silicon dioxide with $\in_i$=3.9 Faradays/centimeter (F/cm). Other common dielectrics such as silicon nitride have a higher permittivity and therefore are not useful for reducing the permittivity of the dielectric.

On the other hand, vacuum has a permittivity of 1.0 F/cm and air a slightly higher 1.001 F/cm. Thus isolating adjacent conductive paths with vacuum, air or with a hybrid structure including a substantial portion of vacuum or air would be a solution. In addition, for any solution that results in a lower permittivity to have broad applicability it would also be required to be structurally sound and readily integrated into a standard semiconductor process. While several proposals for isolating adjacent conductive paths with vacuum, air or a hybrid material have been made, none meets the aforementioned requirements.

An early effort at a solution is seen in U.S. Pat. No. 3,890,636 entitled "MULTILAYER WIRING STRUCTURE OF INTEGRATED CIRCUIT AND METHOD OF PRODUCING SAME" issued to Harada et al. on Jun. 17, 1975 and assigned to Hitachi, Ltd. of Japan. Harada et al. teach a method that requires the formation of metal stanchions between each of the multiple layers of metal to isolate adjacent conductors. Thus the formation of this stanchion requires additional metal deposition, patterning and etching steps to form the stanchions. For a dual layer metal system, three metal depositions and three photolithograhic steps are required rather than two depositions and two patterning steps. In addition, all conductive paths are free standing with no additional supporting structures to provide for strength. Therefore, Harada et al. teaches that thicker and wider conductive paths are required to provide this strength. As it can be seen, the method of Harada et al. requires extra, costly processing steps and wider conductors that are adverse to sizing.

In U.S. Pat. No. 4,933,743, entitled "HIGH PERFORMANCE INTERCONNECT SYSTEM FOR AN INTEGRATED CIRCUIT" issued to Thomas et al. on Jun. 12, 1990 and assigned to Fairchild Semiconductor Corp., a free standing structure is also taught. While Thomas et al. teach enclosing each conductor in a dielectric layer, that layer is primarily proposed to allow the open structure to be backfilled with a metallic material. Additionally, the dielectric layer surrounding the conductors adds little or no strength as it is supported by the metal rather than providing such support. Thus the structure of Thomas et al. does not provide the sound structure required unless additional costly processing is used, such as backfilling with a metallic material.

U.S. Pat. No. 5,119,164 entitled "AVOIDING SPIN-ON-GLASS CRACKING IN HIGH ASPECT RATIO CAVITIES" and issued to Sliwa Jr. et al. on Jun. 2, 1992, is directed to avoiding cracks in a spin-on glass (SOG) used as an insulating layer. The method teaches the deposition of a tungsten (W) layer as a peripheral coating for conductive metal stripes. After a spin-on glass is applied, the W is uncovered by, for example, etching back the spin-on layer. Subsequently the W is removed to form a void adjacent the metal stripe. Upon hard curing of the glass, this void increases in size due to densification of the SOG. While a void is formed, this method requires the deposition of an W layer and its subsequent removal. In addition, the void formed is unpredictable in its size and is easily filled in a multilayer device structure.

U.S. Pat. No. 5,310,700 entitled "CONDUCTOR CAPACITANCE REDUCTION IN INTEGRATED CIRCUITS" was issued to Chuen-der Lien et al. on May 10, 1994 and assigned to the same assignee of the present application, Integrated Device Technology, Inc. Lien et al. disclose a method for reducing the capacitance between a first and a second conductor on a semiconductor substrate. This patent is incorporated by reference herein. Lien et al. teach the formation of a cavity at an approximate midpoint between conductive stripes due to the effect of protrusions, formed at the top of the conductive stripes, upon the filling of the space between with an insulating material such as chemical vapor (CVD) deposited silicon oxide. While the method of Lien et al. is effective, it is both process and design layout dependent and requires forming an air gap independently for each layer.

U.S. Pat. No. 5,407,860 entitled "METHOD OF FORMING AIR GAP DIELECTRIC SPACERS BETWEEN SEMICONDUCTOR LEADS" was issued to Stoltz et al. on Apr. 18, 1995. Stoltz et al. is directed to forming an air gap through the deposition of a non-wetting material, such as Teflon, as a thin layer overlying adjacent metal stripes. Stoltz et al. teach that upon deposition of an insulating material, the surface of the non-wetting material will not be wetted by the insulating material. In this manner, voids are formed. However, Stoltz et al. require a Teflon deposition process that is non-standard and thus difficult to incorporate into a semiconductor process flow. Additionally, the effect of the non-wetting surface is layout dependent making the size of the air gaps, if any, unpredictable.

Another method is taught in U.S. Pat. No. 5,461,003 entitled "MULTILEVEL INTERCONNECT STRUCTURE WITH AIR GAPS FORMED BETWEEN METAL LEADS" issued to Robert H. Haverman on Oct. 24, 1995. Haverman teaches the etching of a disposable dielectric layer through a porous, overlying layer. A silica-based xerogel with a porosity range of between 10–50% is taught by Haverman to be an appropriate porous layer. As it is known, the deposition of such a porous layer is not a standard semiconductor process and the porosity is a function of the removal of the dispersion medium. Thus such a process is difficult to reproducibly perform and integrate with other standard semiconductor process steps. Additionally, as this is a porous layer, additional, non-porous material must be employed to provide "improved structural support and thermal conductivity, and passivat[ion of] the porous dielectric layer" (col. 6, ln. 12–13).

Japanese Pat. No. 1-189939A entitled "SEMICONDUCTOR INTEGRATED CIRCUIT" and issued to Shigeru Murakami on Jul. 31, 1989, is directed to reducing capacitance between wiring on two different levels. Thus Murakami teaches forming an air gap between a lower wire 4 and an upper wire 7. Additionally this gap is formed by removing a photoresist layer using a release agent and anisotropic etching with $CF_4$ gas. Therefore upper wire 7 must be formed over the photoresist layer. Murakami teaches forming upper wire 7 over an existing photoresist layer, which, as it is known, can lead to contamination of the wiring layer. Additionally, Murakami teaches etching with a fluorine containing gas which is a well known etchant of silicon oxide, thus potentially compromising insulating layers formed thereof.

Japanese Pat. No. 1-318248 entitled "SEMICONDUCTOR DEVICE AND MANUFACTURE THEREOF" issued to Takahiro Tsuchitani on Dec. 12, 1989, is directed to reducing the capacitance between an upper wiring level 5 and a lower wiring level 2 through the use of an air gap. Tsuchitani teaches that where an air isolation region 4 is beyond a certain dimension, support for upper wiring level 5 can be provided by forming struts 6. Thus Tsuchitani teaches forming an added structure requiring additional processing to provide for support of the upper wiring layer 5.

It can be seen that while a variety of methods of forming air gaps have been proposed, none provides for reduced capacitance between adjacent conductors on the same level, structural support for multilevel conductors, and easy integration into a semiconductor process flow.

Therefore a need exists for such a structure that provides for a reduced capacitance between adjacent conductive paths or a single level. A need also exists for a reduced-capacitance structure that can provide structural support for multilevel conductors. Finally, a need exists for such a solution to be easily integrated into an existing semiconductor process flow.

SUMMARY

The present invention is directed to a method for forming an insulation structure for adjacent conductive paths in a semiconductor integrated circuit, wherein the structure has a permittivity substantially less than 3.9 F/cm. Additionally, the present invention is directed towards the specific structure formed by such a method.

The present invention provides adjacent conductive paths having substantially all of their sidewalls covered with an insulating layer. Additionally, according to the present invention a disposable layer is formed between the insulating layer covered sidewalls and another insulating layer is formed overlying the disposable layer and the conductive paths to provide structural support for multilevel conductive paths.

In addition, the present invention provides a method for the removal of a disposable layer to form an embodiment of a basic structure having a permittivity of less than 3.9 F/cm. This basic structure can be repeated any number of times to generate a multilayer metal integrated circuit. Prior to each repeated structure, or a final passivation layer, an array of openings is provided to allow removal of the disposable layer at a future process step.

Thus a basic structure is shown that is alternatively a building block or a final structure. In addition a method for creating same is also shown.

DETAILED DESCRIPTION

Embodiments of the present invention will be described with reference to the aforementioned figures. It will be understood that these drawings are simplified for ease of understanding and description only. Various modifications will become apparent to those skilled in the art as embodiments of the present invention are described. All such modifications or variations that rely upon the teachings of the present invention, and through which these teachings have advanced the art, are considered to be within the spirit and scope of the present invention.

Figure 1:
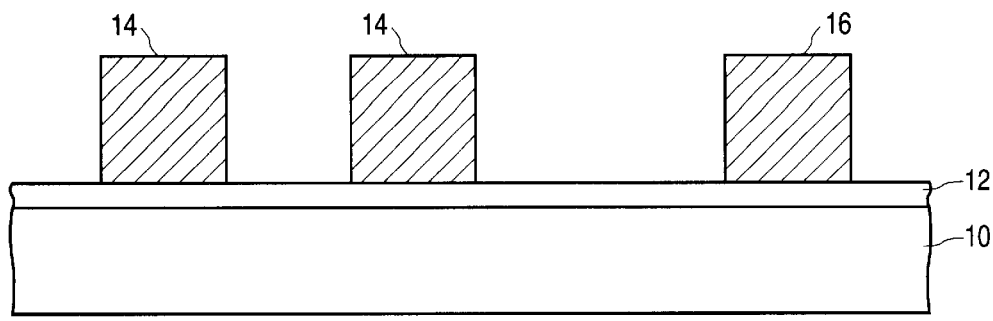
FIGS. 1–3 and 5 are simplified cross-sectional views of a portion of an integrated circuit at various stages in the fabrication of an embodiment of the present invention.

FIG. 1 is a simplified cross sectional view of a portion of an integrated circuit (IC) at an early stage of fabrication of an embodiment of the present invention. The portion illustrated includes a semiconductor substrate 10, an insulating layer 12, a pair of closely spaced first conductive paths 14 and a spaced apart conductive path 16.

It will be understood that semiconductor substrate 10 has a plurality of regions (not shown) that contain a variety of semiconductor device elements such as transistors, diodes, resistors and the like as are well known in the art. For ease of illustration and understanding, a single region without such devices is shown throughout the illustrations contained herein.

First insulating layer 12 overlies substrate 10 and serves to electrically isolate conductive paths 14 and 16 from substrate 10. Typically, insulating layer 12 is a thermally grown silicon oxide layer, although other insulating materials formed in other manners can also be used. For example silicon nitride or any of the various silicon oxynitrides can be formed in place of silicon oxide. In addition, combinations of thermally grown silicon oxide and deposited insulators can also be employed for first insulating layer 12. Closely spaced conductive paths 14 and spaced apart conductive path 16 are disposed on layer 12. Conductive paths 14 and 16 are typically aluminum or any of the commonly used aluminum alloys. However, paths 14 and 16 can alternatively include any of the conductive materials known to those skilled in the art of IC fabrication or combinations thereof. For example, paths 14 and 16 can be polysilicon or a metal silicide or a combination thereof as an alternative to aluminum or the like.

Figure 2:
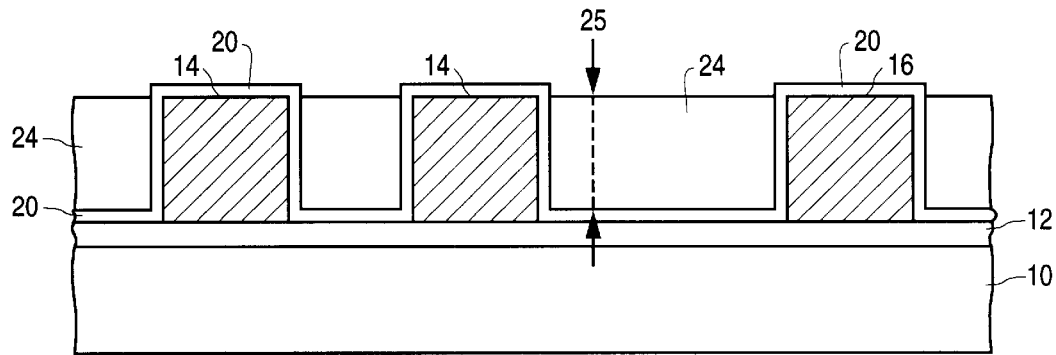

Referring now to FIG. 2, a conformal layer 20 or second insulating layer 20 is formed overlying-substrate 10. As conformal layer 20 completely covers insulating layer 12 and conductive paths 14 and 16, and as no etching of conformal layer 20 is done to achieve such complete coverage, layers 12 and 20 can be formed from the same material. Therefore if layer 12 is silicon oxide, second insulating layer 20 can be formed from silicon oxide using, for example, a plasma enhanced chemical vapor deposition (PECVD) process. Alternatively, different materials for layers 12 and 20 can be selected. Thus where layer 12 is silicon oxide, a layer of silicon nitride or some other dielectric material can be employed for layer 20 and formed using any of the well known methods that produce an essentially conformal layer. Selection of a specific material for layer 12 and layer 20 is design choice within the spirit and scope of the present invention.

As it is known, several factors will influence the thickness of conformal layer 20. These will include the actual material selected, the spacing between closely spaced paths 14, whether or not additional layers of conductive paths will be formed overlying at least a portion of conformal layer 20, and other considerations known to those of skill in the art. In a typical double layer metal integrated circuit, second insulating layer 20 is at least approximately 100 nanometers (nm) thick.

Once conformal layer 20 has been formed, disposable layer 24 is formed. Disposable layer 24, in one embodiment of the present invention, is a polyimide material or other organic material capable of withstanding subsequent processing steps without significant change or decomposition. In another embodiment, layer 24 is a spin-on-glass having a carbon concentration of at approximately 10 weight percent (wt. %) or greater, and in still another embodiment of the present invention disposable layer 24 is a phosphorous-doped glass material having a phosphorous concentration sufficient to allow removal of layer 24 while layers 20 and 26 are essentially not etched. For example, where either or both of layers 20 and 26 are an essentially undoped oxide material, a phosphorus concentration of approximately 3 wt. % or greater has been found desirable.

Disposable layer 24 can be formed by a first process to overlie all of substrate 10, including conductive paths 14 and 16 and conformal layer 20. Alternatively, layer 24 can be formed by a second process to fill only the area between adjacent conductive paths 14, 16 and thus not overlie conductive paths 14, 16. Where the first process is employed, a subsequent etchback step, as is well known in the art, is performed to expose at least a top portion of conductors 14 and 16 as shown in FIG. 2. Thickness 25 of disposable layer 24, either upon deposition or after an etchback process, is selected to be approximately equal to but no greater than that of conductive paths 14 and 16. Thus if conductive paths 14 and 16 are aluminum with a thickness of 500 nm, thickness 25 will be approximately 400 to 500 nm, although thinner layers are also acceptable. It will be understood that where an etchback is required to arrive at an appropriate thickness 25, as discussed above, that such an etchback process should not significantly etch layer 20. Thus an etchback process will typically have a selectivity ratio of layer 24 to layer 20 of at least approximately 10:1.

Figure 3:
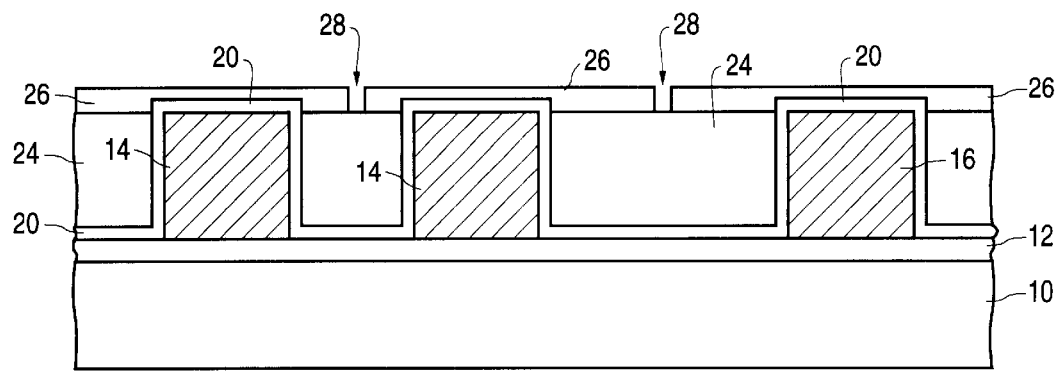
Figure 4:
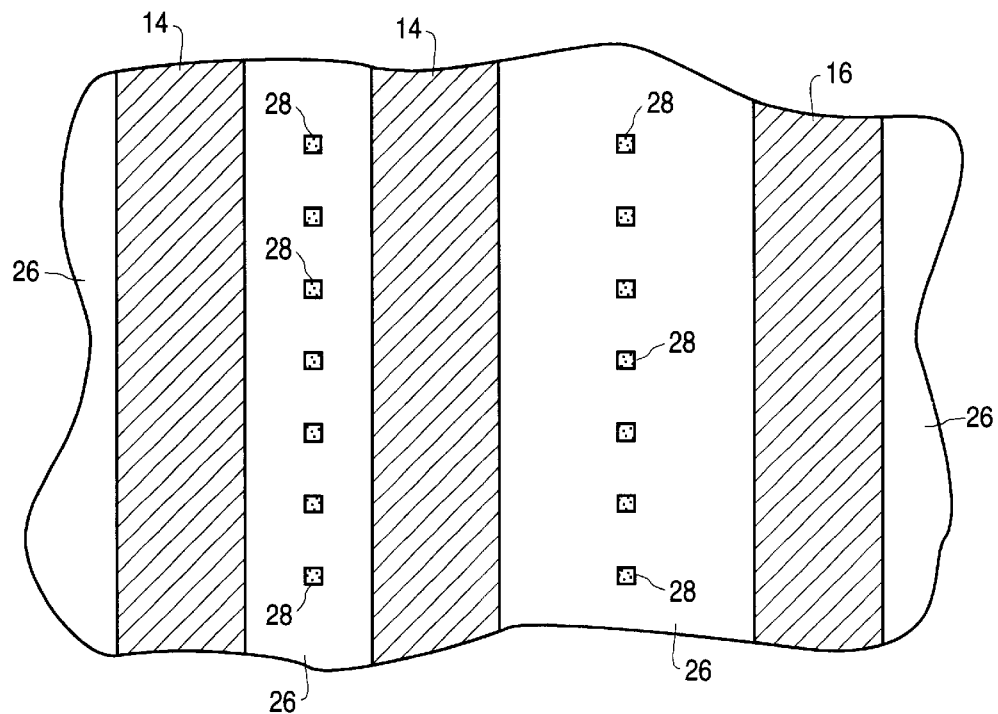
FIG. 4 is a top-down view of the cross sectional view of FIG. 3.

Turning to FIG. 3, a third insulating layer 26 is formed overlying substrate 10 having a plurality of air gap ports 28 formed therein. In FIG. 4, a top down view of the cross sectional view of FIG. 3, a typical arrangement of air gap ports 28 is illustrated. Thus ports 28 are disposed between conductive paths 14 and 16 in an array. The specific number and location of air gap ports 28 is determined by the specific integrated circuit design and material selected for disposable layer 24.

Returning to FIG. 3, third layer 26 is formed of any one of a variety of materials as previously described for second dielectric layer 20. However, typically third layer 26 is selected to be the same composition as second layer 20 to facilitate formation of contact openings or vias as will be described with respect to another embodiment of the present invention.

A photoresist masking layer (not shown) is disposed over third layer 26 and patterned to expose selected regions of layer 26. These selected regions are then etched to form air gap ports 28 and the masking layer is removed. It will be understood that the process selected for etching air gap ports 28 will depend upon the specific material selected for formation of third insulating layer 26. Thus any one of the commonly known etch processes for dielectric or insulating materials such as silicon oxide or silicon nitride can be selected. For example where layer 26 consists of silicon oxide, ports 28 can be formed by etching in a plasma containing $C_2F_6$ gas.

Once air gap ports 28 are formed, disposable layer 24 is removed. As those of ordinary skill in the art will know, it is possible to remove the aforementioned masking layer and disposable layer 24 in one step. Thus if layer 24 consists of organic material or carbon-containing SOG, as previously described, both layer 24 and the photoresist masking layer can be removed using an oxygen plasma etch. Such oxygen plasma etch processes are well known for stripping or etching organic materials in semiconductor processing. Thus said photoresist layer is removed from a surface of layer 26 while disposable layer 24 is removed through said air gap ports 28. Other processes may also be employed, for example, an ultra violet induced ozone stripping process is also known and can be used to remove both layer 24 and the aforementioned photoresist masking layer. If disposable layer 24 consists of a heavily doped phosphorus containing glass, it can be removed by etching with a solution containing fluoride ions as is known in the semiconductor arts.

Figure 5:
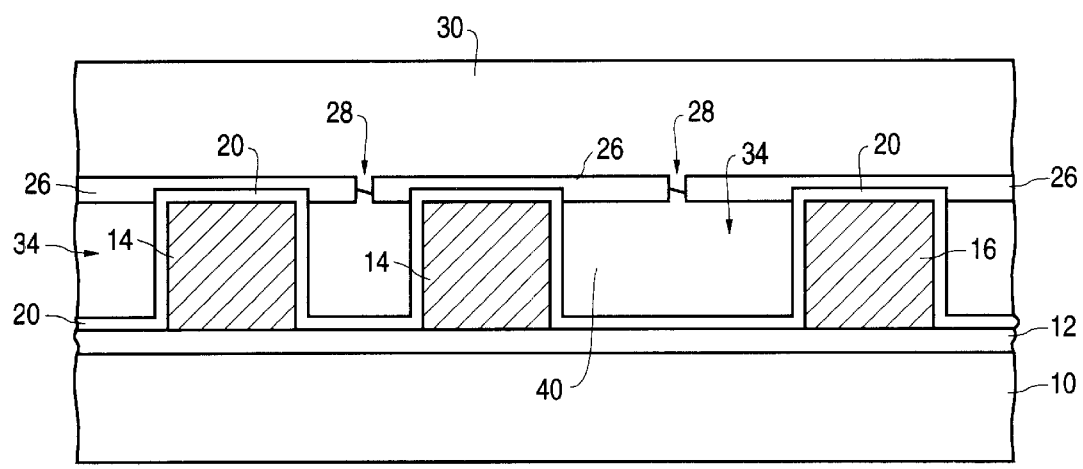

Referring to FIG. 5, air gaps 34 have been formed by removal of disposable layer 24 as previously discussed. As it can be seen, air gaps 34 are defined in a first direction, between adjacent conductive paths, by conformal layer 20 overlying sidewalls of each conductive path. In a second direction, air gap 34 is defined by layers 20 and 12 at lower boundary and third insulating layer 26 at an upper boundary. Thus a new insulation structure 40 is formed, disposed between adjacent conductive paths on a single level, from air gaps 34, portions of conformal layer 20 and third insulating layer 26. Inclusion of air gap 34 in structure 40 results in a reduced permittivity over that of, for example silicon oxide. Hence, capacitance between adjacent conductive paths will be reduced. A passivation layer 30 is formed overlying third layer 26 and covering or sealing air gap ports 28. While some material of passivation layer 30 can enter air gaps 34 by means of air gap ports 28 during a deposition process, such filling can be minimized through design of ports 28 and selection of a deposition process for passivation layer 30. Thus, as it is known, atmospheric deposition of silicon oxide will tend to close ports 28 well before any significant filling of gaps 34 occurs.

Thus by and through the above descriptions of FIGS. 1–5, an embodiment of the present invention has been disclosed. As seen in FIG. 5, air gaps 34 form a significant portion of insulation structure 40 disposed between conductive lines 14 and 16. Therefore, as the capacitance of structure 40 is a function of the permittivity of each component of structure 40 divided by its thickness, and whereas the largest portion is air having a permittivity of 1.001 $F/cm^2$, it can be seen that capacitance has been greatly reduced from that of a solid silicon oxide insulator, and will be less than 3.9 $F/cm^2$.

Figure 6:
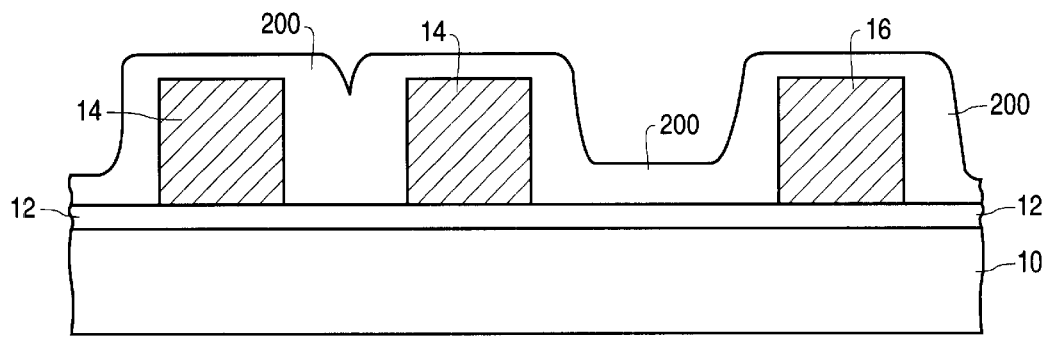
FIGS. 6–8 are simplified cross-sectional views of a portion of an integrated circuit at various stages in the fabrication of another embodiment of the present invention.

Turning now to FIG. 6, another embodiment of the present invention is illustrated wherein the structure of FIGS. 1–5 is formed by an alternative method. For ease of understanding and comparison, similar features are labeled using the numbering of FIGS. 1–5. Thus FIG. 6 shows closely spaced first conductive paths 14, and a spaced apart conductive path 16 disposed over insulating layer 12, which in turn is disposed over semiconductor substrate 10. However this embodiment employs a non-conformal insulating layer 200 disposed over and between conductive paths 14 and 16.

Figure 7:
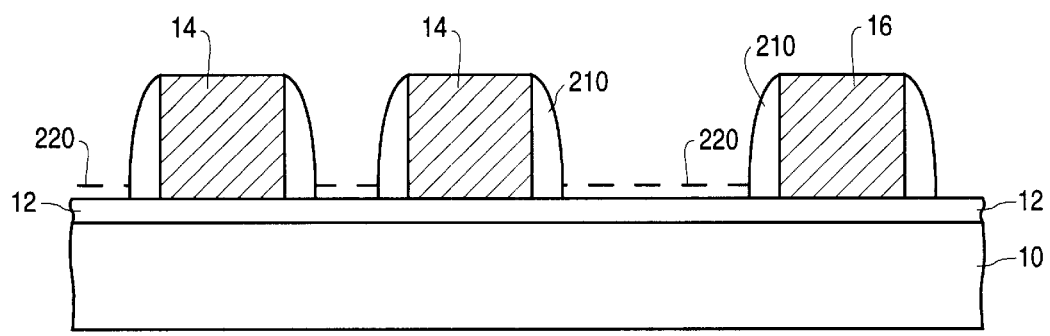

Referring now to FIG. 7, insulating layer 200 has been etched back to form dielectric spacers 210 which continue to overlie a major portion of conductive paths 14 and 16. It will be understood that while layer 200 is shown formed into discrete spacers 210, this is not essential. Thus spacers 210 can retain some connectivity overlying layer 12 as indicated by dashed lines 220 between conductive paths 14 and 16. Additionally, spacers 210 can be formed where a portion or all of an upper surface of conductive paths 14 and 16 remain covered by layer 200. Layer 200 can consist of a variety of insulating materials, for example silicon oxide, silicon nitride or the like. The specific material selected is a design choice determined by a variety of factors including, but not limited to, the spacing between conductive paths, the composition of layer 12 and both the etchback process and desired profile of spacers 210. Any and all of these design choices are intended to fall within the spirit and scope of the present invention.

Figure 8:
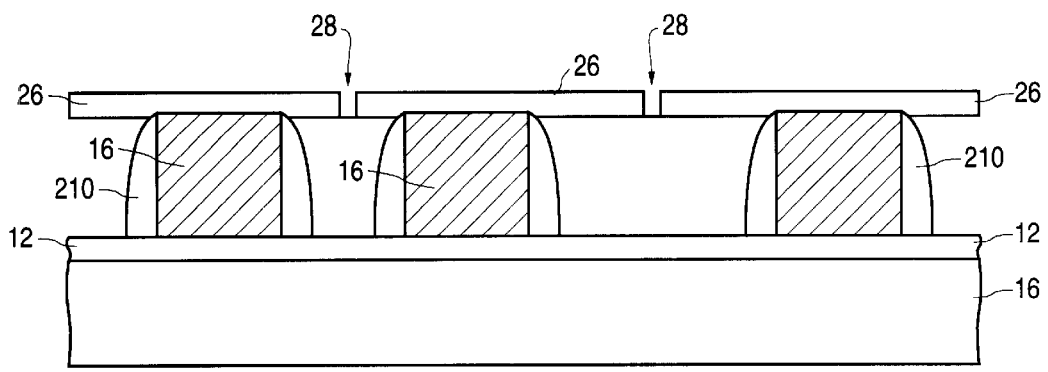

Turning now to FIG. 8, a structure at a subsequent process step is shown that is equivalent to the structure previously shown in FIG. 3. Thus disposable layer 24 has been formed as previously discussed with respect to FIG. 2, as has second insulation layer 26 and air gap ports 28. While FIG. 8 shows layer 26 directly coupled to conductive paths 14 and 16, where layer 200 remains overlying paths 14 and 16, as previously mentioned, layer 26 is indirectly coupled to paths 14 and 16. In this manner paths 14 and 16 provide physical support for layer 26. It will be understood that additional structures, equivalent to FIGS. 4 and 5, can be formed for this embodiment of the present invention. In the manner previously taught, disposable layer 24 is etched through air gap ports 28. In this manner, an insulating structure for this embodiment is formed which includes an air gap, as a principal component, as well as spacers 210 and second insulating layer 26. It will be understood that if spacers 210 are not formed as fully separated spacers 210, but rather spacers 210 connected as indicated by hatched line 220, then this additional material will be included in the insulation structure. Therefore, an alternative embodiment of the present invention shown has been shown where a capacitance significantly less than 3.9 $F/cm^2$ is provided.

Figure 9:
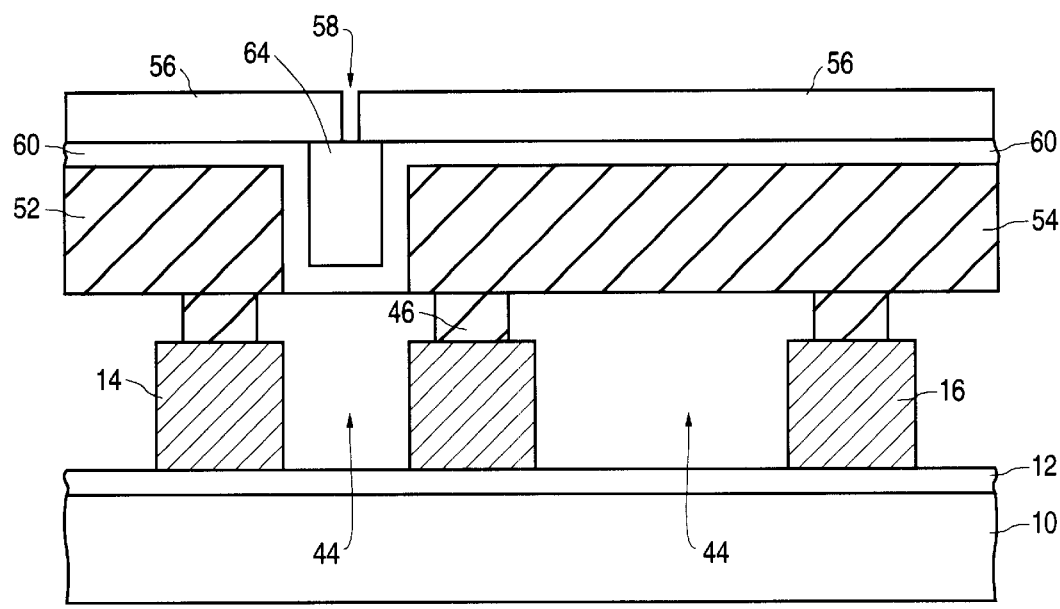
FIGS. 9 and 10 are simplified cross-sectional views of a portion of an integrated circuit at a stage in the fabrication of still another embodiment of the present invention.

Other embodiments of the present invention are also possible. Now turning to FIG. 9, an embodiment of the present invention is shown where air gaps are disposed between adjacent conductive paths 52 and 54 that form a second or upper conductive layer. As will be seen, no air gaps are formed on a lower conductive layer containing paths 14 and 16. It will be noted that FIG. 9 is analogous to previously discussed FIG. 3.

Semiconductor substrate 10 is shown with insulating layer 12 disposed thereon. Closely spaced conductive paths 14 and spaced apart conductive path 16 are formed as previously discussed. However, rather than forming insulating structure 40, a standard insulating structure 44 is formed. Structure 44 is illustrated as having vias 46 formed therein to provide for electrical coupling of conductors 52 and 54 to conductors 14 and 16, respectively. The manner of forming vias 46 is well known in the semiconductor arts and not essential to this embodiment of the present invention.

As shown, second conformal layer 60 is formed overlying conductors 52 and 54. Second conformal layer 60 can be formed using methods and materials as discussed previously with respect to conformal layer 20. In addition, the thickness of second conformal layer 60 is a design choice as previously discussed for layer 20; however, a typical thickness employed is approximately 100 nm. Second disposable layer 64, shown disposed between conductors 52 and 54, is formed in a manner, and of materials discussed previously with respect to disposable layer 24. As was indicated in the discussion of thickness 25, thickness of disposable layer 64 is also important. Therefore it will be understood, that second disposable layer 64 is analogous to layer 24 and has a thickness no greater than a thickness of conductive paths 52 and 54.

Fourth insulating layer 56 is disposed overlying conductive paths 52 and 54 and disposable layer 64. Layer 56 is formed in a manner, and of materials, as discussed previously with respect to third insulating layer 26. A second air gap port 58 is formed in insulating layer 56 in a manner as discussed with respect to air gap ports 28 employing a photoresist masking layer (not shown). While only one second air gap port is illustrated, it will be understood that this is for simplicity of illustration and understanding only. In an actual embodiment, many second air gap ports 58 are typically formed. Once air gap port 58 is formed, disposable layer 64 can be removed. It is possible to remove the aforementioned masking layer and disposable layer 64 in a single process step as previously discussed.

Figure 10:
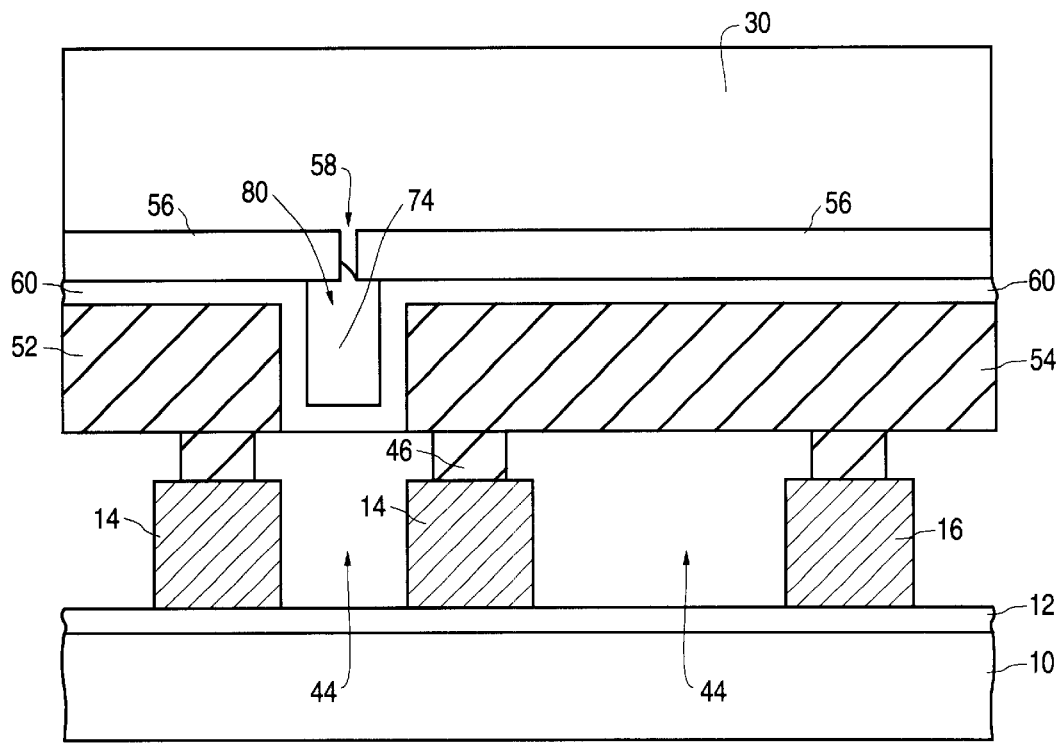

FIG. 10 illustrates this embodiment of the present invention where disposable layer 64 has been removed to form second air gap 74. Additionally, passivation layer 30 has been formed overlying substrate 12 and in particular fourth insulating layer 56, thus sealing air gap port 58. Thus, a second insulation structure 80 is formed that is analogous to embodiments of insulation structure 40 previously discussed. The benefits of reduced capacitance and structural integrity are therefore enjoyed in this alternative embodiment.

Figure 11:
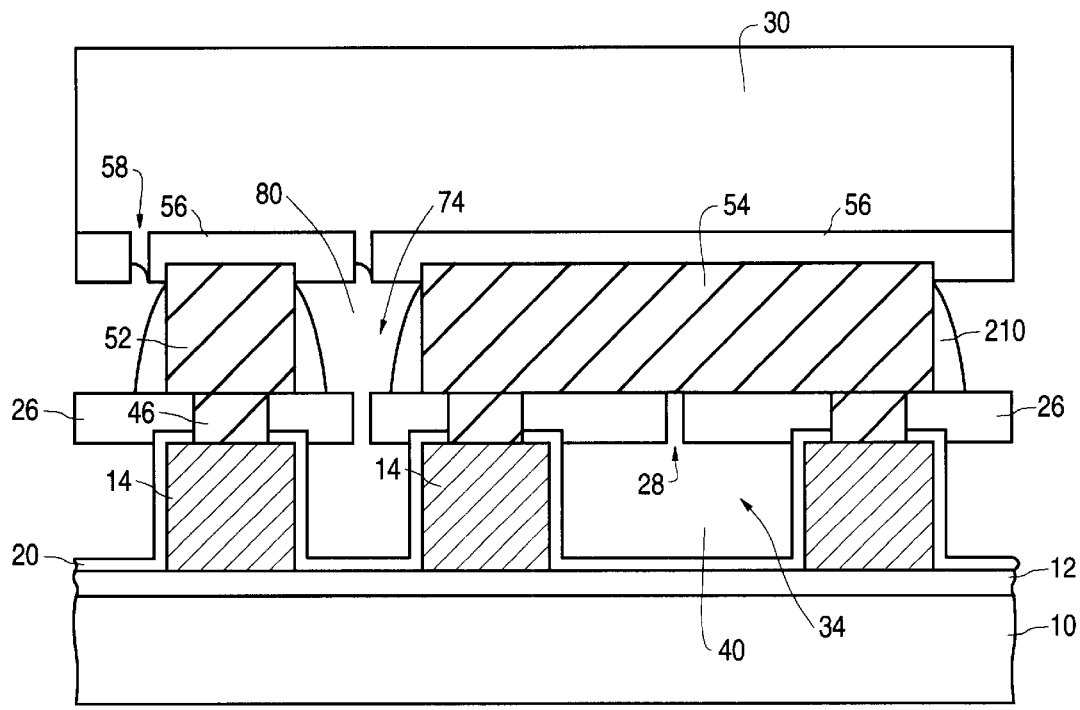
FIG. 11 is a simplified cross sectional view of a portion of an integrated circuit at a stage in the fabrication of still another embodiment of the present invention.
Figure 12:
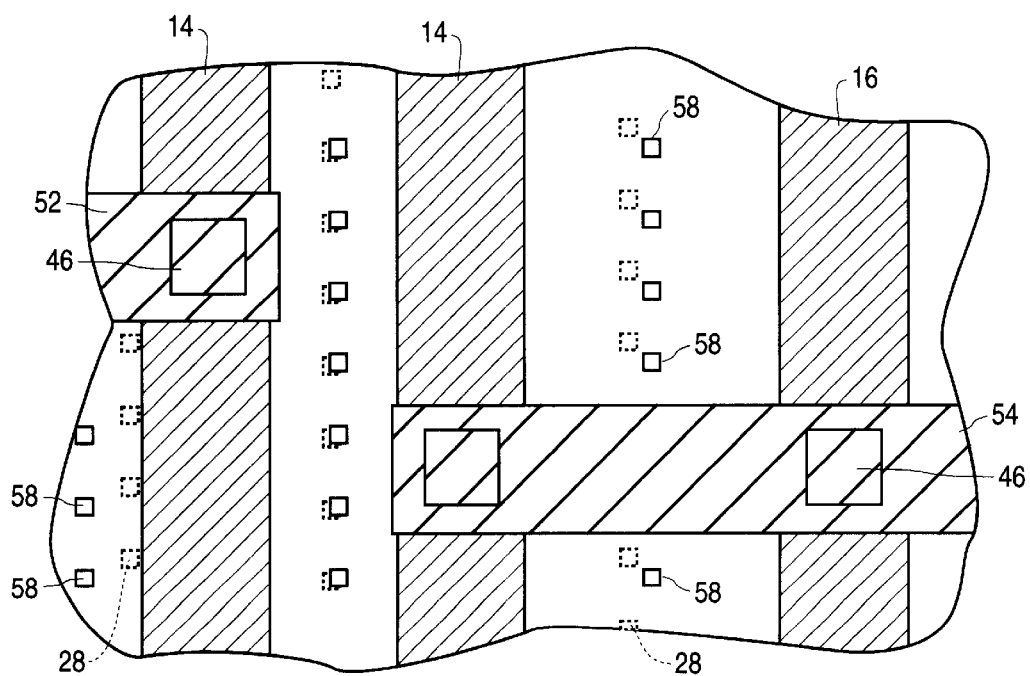
FIG. 12 is a top down view of the cross-sectional view of FIG. 11.

Still other embodiments of the present invention are possible. Thus an integrated circuit may be formed that incorporates an insulating structure of the present invention for both a first level of conductive paths and a second level of conductive paths. Such a structure is illustrated in FIGS. 11 and 12. FIG. 11 illustrates a simplified cross-sectional view of this multilevel embodiment and FIG. 12 illustrates a top down view of FIG. 11. It will be understood that the structures and methods previously taught are used to fabricate the structure depicted in FIGS. 11 and 12. However, it should be realized that air gap 34 of insulating structure 40 and second air gap 74 of second insulating structure 80 are formed with one process step.

Referring to FIG. 12, it can be seen that this is possible without regard to placement of second level conductive paths where a sufficient array of air gap ports 28 and 58 are provided. Thus in FIG. 12 air gap ports 58 are represented having solid lines and air gap ports 28 having dashed lines. It will be understood that both FIG. 11 and 12 are simplified drawings created for ease of understanding and description only. Therefore, air gap ports 28 and 58 can align as shown or is can not align. Additionally, in some embodiments insulation structure 80 is aligned to insulation structure 40 and in other embodiments these structures are not aligned. Finally, in some embodiments a mixture of aligned and non-aligned structures such as air gap ports 28 and 58 or insulation structures 40 and 80 are possible. Such alignment and non-alignment of structures described or illustrated herein are understood to be design choices within the scope and spirit of the present invention.

Thus several embodiments of a new insulation structure having a reduced permittivity and superior structural integrity have been shown. In addition, several embodiments of methods for fabricating the new insulation structures have also been demonstrated.

The new insulation structure includes a significant amount of air thus significantly reducing the permittivity of the structure. This reduction in permittivity of the insulation structure will create a corresponding reduction-in capacitance. As a result, the RC time constant and level of cross-talk between adjacent conductive paths is reduced. Additionally, the new insulation structure provides an insulation layer having air gap ports formed therein. It will be realized that this insulation layer overlies conductive paths which provide physical support for the layer. By providing an array of air gap ports formed in this insulating layer, the layer can remain essentially continuous and thus retain sufficient structural strength to take advantage of the physical support provided by the underlying conductive paths. In this manner it is possible to support additional layers of insulating and conductive materials. Finally, the method of forming the insulating structures of the present invention allows all air gaps within such insulating structures to be formed in a single process step.

What is claimed is:

1. A semiconductor integrated circuit with an insulation structure having a reduced permittivity, said insulation structure comprising:

a first insulating layer overlying a semiconductor substrate;

a plurality of conductive paths overlying said first insulating layer;

a second insulating layer overlying at least a major portion of adjacent conductive paths wherein said second insulating layer comprises an insulating material selected from the group consisting of silicon oxide, silicon nitride, silicon oxynitride, and combinations thereof, a third insulating layer overlying each adjacent conductive path and extending from one to another, wherein said third insulating layer comprises a material the same as or different from the material of said second insulating layer;

an air gap defined in a first direction by said second insulating layer overlying sidewalls of each adjacent conductive path and in a second direction by a lower boundary of said first and/or second insulating layer and at an upper boundary by said third insulating layer; and a plurality of air gap ports formed in said third insulating layer, wherein each air gap port is positioned between adjacent conductive paths whereby a disposable material is removed through said plurality of air gap ports.

2. The integrated circuit of claim 1 further comprising a passivation layer overlying the third insulating layer and sealing the air gap port.

3. The integrated circuit of claim 1 wherein the first and second insulating layers are comprised of substantially different materials.

4. The integrated circuit of claim 1 wherein the second insulating layer is a conformal layer.

5. The integrated circuit of claim 1 wherein the first insulating layer overlies a first interconnect layer.

6. The integrated circuit of claim 1 wherein the insulating layers defining the air gap form an insulating structure having a permittivity less than 3.9 F/cm$^2$.

* * * * *